United States Patent
Parkhe

(10) Patent No.: US 10,541,171 B2
(45) Date of Patent: Jan. 21, 2020

(54) PROTECTIVE COVER FOR ELECTROSTATIC CHUCK

(71) Applicant: Applied Materials, Inc., Santa Clara, CA (US)

(72) Inventor: Vijay D. Parkhe, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 195 days.

(21) Appl. No.: 15/840,905

(22) Filed: Dec. 13, 2017

(65) Prior Publication Data
US 2018/0102275 A1 Apr. 12, 2018

Related U.S. Application Data

(62) Division of application No. 14/256,781, filed on Apr. 18, 2014, now Pat. No. 9,887,121.

(Continued)

(51) Int. Cl.
*H01L 21/687* (2006.01)
*H01L 21/683* (2006.01)
(Continued)

(52) U.S. Cl.
CPC ...... *H01L 21/68757* (2013.01); *B08B 7/0035* (2013.01); *C04B 35/44* (2013.01);
(Continued)

(58) Field of Classification Search
None
See application file for complete search history.

(56) References Cited

U.S. PATENT DOCUMENTS

| 4,439,248 A | 3/1984 | Herchenroeder et al. |
| 5,381,944 A | 1/1995 | Makowiecki et al. |

(Continued)

FOREIGN PATENT DOCUMENTS

| DE | 200301654 | 6/2003 |
| JP | 2000306986 A | 11/2000 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Nicole Blan
(74) *Attorney, Agent, or Firm* — Lowenstein Sandler LLP

(57) ABSTRACT

A protective cover for an electrostatic chuck may include a conductive wafer and a plasma resistant ceramic layer on at least one surface of the conductive wafer. The plasma resistant ceramic layer covers a top surface of the conductive wafer, side walls of the conductive wafer and an outer perimeter of a bottom surface of the conductive wafer. Alternatively, a protective cover for an electrostatic chuck may include a plasma resistant bulk sintered ceramic wafer and a conductive layer on a portion of a bottom surface of the plasma resistant bulk sintered ceramic wafer, wherein a perimeter of the bottom surface is not covered. The protective layer may be used to protect an electrostatic chuck during a plasma cleaning process.

20 Claims, 6 Drawing Sheets

Related U.S. Application Data

(60) Provisional application No. 61/816,547, filed on Apr. 26, 2013.

(51) Int. Cl.
*H01L 21/67* (2006.01)
*C04B 35/48* (2006.01)
*C04B 35/44* (2006.01)
*C04B 35/505* (2006.01)
*C23C 14/08* (2006.01)
*C23C 16/44* (2006.01)
*B08B 7/00* (2006.01)
*H01J 37/32* (2006.01)

(52) U.S. Cl.
CPC ............ *C04B 35/48* (2013.01); *C04B 35/505* (2013.01); *C23C 14/081* (2013.01); *C23C 14/083* (2013.01); *C23C 16/4405* (2013.01); *H01J 37/32862* (2013.01); *H01L 21/67011* (2013.01); *H01L 21/67017* (2013.01); *H01L 21/6831* (2013.01); *Y10T 279/3493* (2015.01)

(56) References Cited

U.S. PATENT DOCUMENTS

| | | | |
|---|---|---|---|
| 5,548,470 A | 8/1996 | Husain et al. | |
| 5,631,803 A | 5/1997 | Cameron et al. | |
| 5,800,871 A | 9/1998 | Collins et al. | |
| 5,916,689 A | 6/1999 | Collins et al. | |
| 6,063,203 A | 5/2000 | Satoh | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,506,254 B1 | 1/2003 | Bosch et al. | |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,805,952 B2 | 10/2004 | Chang et al. | |
| 6,916,559 B2 | 7/2005 | Murakawa et al. | |
| 6,933,254 B2 | 8/2005 | Morita et al. | |
| 6,942,929 B2 | 9/2005 | Han et al. | |
| 7,441,688 B2 | 10/2008 | Van Heerden et al. | |
| 7,615,133 B2 | 11/2009 | Tateno et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,718,007 B2 | 5/2010 | Oohashi et al. | |
| 7,810,704 B2 | 10/2010 | Duckham et al. | |
| 7,929,269 B2 | 4/2011 | Rusinko, Jr. et al. | |
| 7,964,517 B2 | 6/2011 | Jaiswal | |
| 8,034,734 B2 | 10/2011 | Sun et al. | |
| 8,075,729 B2 | 12/2011 | Holland et al. | |
| 8,206,829 B2 | 6/2012 | Sun et al. | |
| 8,404,572 B2 | 3/2013 | Chang et al. | |
| 2003/0007308 A1 | 1/2003 | Harada et al. | |
| 2003/0047802 A1 | 3/2003 | Hiramatsu et al. | |
| 2004/0117977 A1 | 6/2004 | Hiramatsu | |
| 2004/0187787 A1 | 9/2004 | Dawson et al. | |
| 2005/0266682 A1 | 12/2005 | Chen et al. | |
| 2006/0164785 A1 | 7/2006 | Pellegrin | |
| 2007/0047170 A1 | 3/2007 | Sun et al. | |
| 2007/0212567 A1 | 9/2007 | Esaki et al. | |
| 2008/0016684 A1 | 1/2008 | Olechnowicz et al. | |
| 2008/0029032 A1 | 2/2008 | Sun et al. | |
| 2008/0174930 A1 | 7/2008 | Hattori et al. | |
| 2008/0264564 A1 | 10/2008 | Sun et al. | |
| 2008/0264565 A1 | 10/2008 | Sun et al. | |
| 2008/0268645 A1 | 10/2008 | Kao et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |
| 2009/0036292 A1 | 2/2009 | Sun et al. | |
| 2009/0108414 A1 | 4/2009 | Tsukatani | |
| 2009/0188526 A1* | 7/2009 | Tsutae | B08B 7/0035 134/1.1 |
| 2009/0214825 A1 | 8/2009 | Sun et al. | |
| 2009/0284894 A1 | 11/2009 | Cooke | |
| 2010/0053841 A1 | 3/2010 | Rusinko, Jr. et al. | |
| 2010/0116788 A1 | 5/2010 | Singh et al. | |
| 2010/0119843 A1 | 5/2010 | Sun et al. | |
| 2010/0177454 A1 | 7/2010 | Elliot et al. | |
| 2010/0314356 A1 | 12/2010 | Nagayama et al. | |
| 2011/0049729 A1 | 3/2011 | Naundorf et al. | |
| 2011/0149462 A1 | 6/2011 | Kugimoto et al. | |
| 2011/0174441 A1 | 7/2011 | Yamashita et al. | |
| 2012/0034469 A1 | 2/2012 | Sun et al. | |
| 2012/0076574 A1 | 3/2012 | Parkhe | |
| 2012/0104703 A1 | 5/2012 | Sun et al. | |
| 2012/0141661 A1 | 6/2012 | Cho et al. | |
| 2012/0299253 A1 | 11/2012 | Kosakai et al. | |
| 2012/0301679 A1 | 11/2012 | Goto | |
| 2012/0307412 A1 | 12/2012 | Boyd, Jr. et al. | |
| 2013/0019797 A1 | 1/2013 | Tanaka et al. | |
| 2013/0026720 A1 | 1/2013 | Hori et al. | |
| 2013/0224675 A1 | 8/2013 | Park | |

FOREIGN PATENT DOCUMENTS

| | | |
|---|---|---|
| JP | 2001308075 A | 11/2001 |
| JP | 2006216224 A | 8/2006 |
| JP | 2008016709 A | 1/2008 |
| WO | WO2001024581 | 4/2001 |
| WO | WO2003100843 | 12/2003 |
| WO | WO2005027203 A2 | 3/2005 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Di Girolamo et al., "Microstructure and thermal properties of plasma-sprayed ceramic thermal barrier coatings," Energia, Ambiente e Innovazione, Published Jan.-Feb. 2013.

Bergant et al., "Porosity evaluation of flame-sprayed and heat-treated coatings using image analysis," Image Anal Stereol 2011;30:53-62, Published Jan. 27, 2011.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

International Search Report & Written Opinion of the International Searching Authority dated Aug. 25, 2014, in International Application No. PCT/US2014/035039.

* cited by examiner

PROTECTIVE COVER FOR ELECTROSTATIC CHUCK

RELATED APPLICATIONS

This application is a divisional patent application of U.S. patent application Ser. No. 14/256,781, filed Apr. 18, 2014, which claims the benefit of U.S. Provisional Application No. 61/816,547 filed on Apr. 26, 2013, both of which are herein incorporated by reference.

TECHNICAL FIELD

Embodiments of the present invention relate to a protective cover for an electrostatic chuck that can protect an electrostatic chuck during a cleaning process.

BACKGROUND

Electrostatic chucks are used to support substrates during processing. One function of an electrostatic chuck is to regulate a temperature of the supported substrate. To facilitate such temperature regulation, a surface of the electrostatic chuck that supports the substrate includes multiple surface features including mesas and a sealing band around a perimeter of the surface. During processing, a heat conductive fluid such as helium gas is pumped into an interface between the electrostatic chuck and the supported substrate. The sealing band seals the interface between the electrostatic chuck and the suspended substrate, preventing the heat conductive fluid from escaping. Over time, processing and cleaning of the electrostatic chuck erodes the surface features such as the sealing band and mesas, increasing their roughness, reducing a height of the mesas, and introducing leakage pathways. This introduces or increases a leakage rate of the fluid.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Described herein are embodiments of a protective cover for an electrostatic chuck. The protective cover is a wafer or other component that may be chucked by the electrostatic chuck during a cleaning process such as a plasma cleaning process. The protective cover may include a plasma resistant ceramic portion and a conductive portion. The conductive portion enables the protective cover to be secured (e.g., chucked) by the electrostatic chuck. The plasma resistant ceramic portion enables the protective cover to shield the electrostatic chuck from attack by corrosive chemistries of a plasma used in the plasma cleaning process. Alternatively, the protective cover may include a plasma resistant ceramic wafer that has been doped or otherwise treated to cause the plasma resistant ceramic wafer to have a resistivity of less than about $10^{13}$ Ohm-cm.

In one embodiment, a plasma resistant bulk sintered ceramic wafer is provided, and at least a portion of a bottom surface of the wafer is coated with a conductive layer such as silicon. In another embodiment, a conductive wafer (e.g., a silicon wafer or silicon carbide wafer) is provided, and a top surface, side walls and at least a portion of a bottom surface of the conductive wafer is coated with a plasma resistant ceramic layer.

An electrostatic chuck can be a costly chamber component for processing chambers. Embodiments of protective covers for electrostatic chucks described herein can prolong the lifespan of electrostatic chucks from about 100-200 radio frequency hours (RFHrs) for an allowed helium leak rate of 1.5 SCCM to up to about 5000 RFHrs. Accordingly, embodiments of protective covers described herein can prolong the life span of the electrostatic chucks up to about 20 times the life spans of traditional electrostatic chucks, thus providing cost savings for consumers of the electrostatic chucks.

Figure 1:
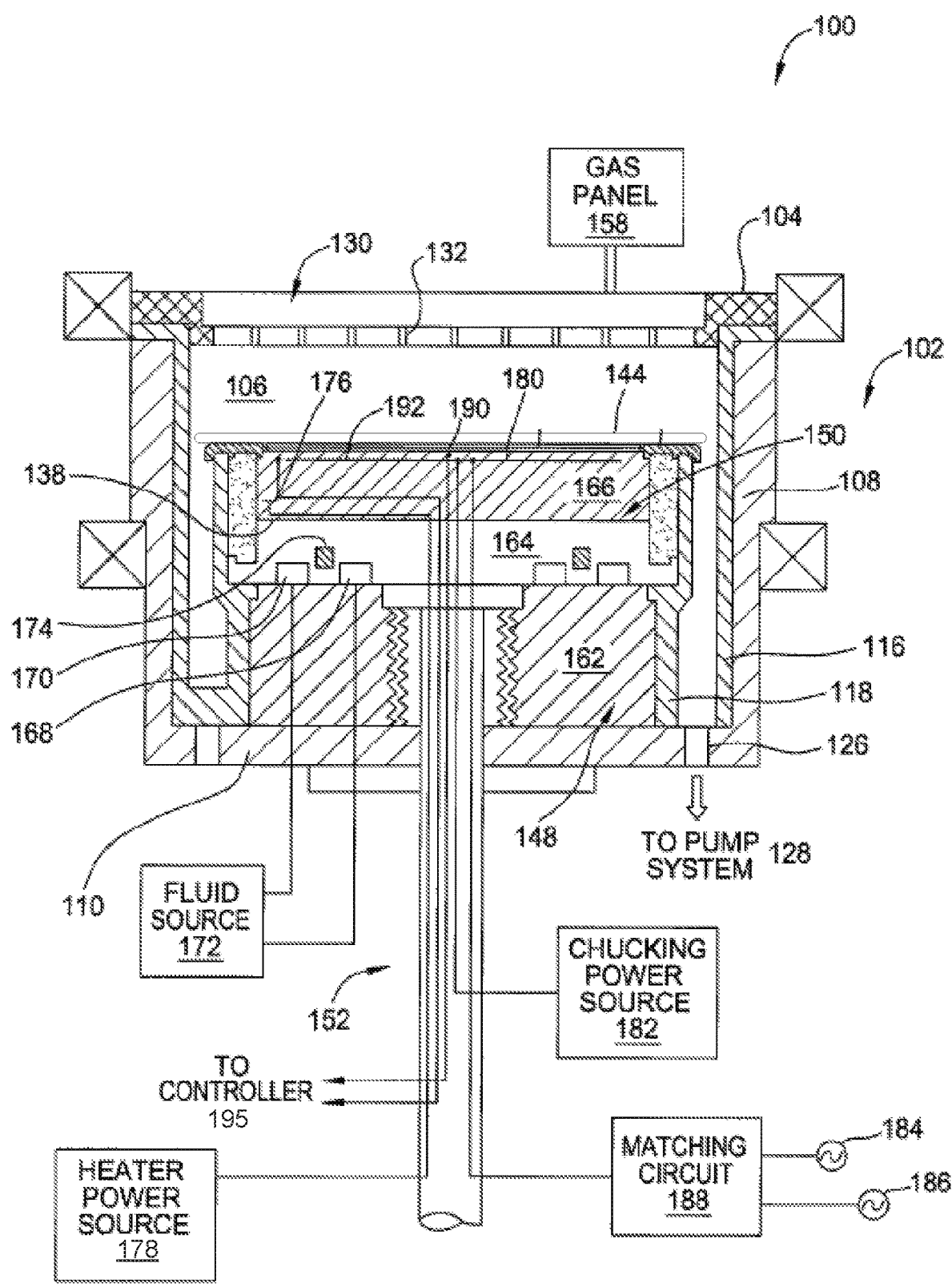
FIG. 1 depicts a sectional view of one embodiment of a processing chamber including a protective cover on a substrate support assembly.

FIG. 1 is a sectional view of one embodiment of a semiconductor processing chamber 100 having a substrate support assembly 148 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). Examples of cleaning gases that may be used to clean components in the interior volume 106 include chlorine, fluorine, bromine, and other corrosive gases that are usable to produce a plasma suitable for cleaning.

The gas distribution assembly 130 may have multiple apertures 132 on the downstream surface of the gas distribution assembly 130 to direct the gas flow. Additionally, the gas distribution assembly 130 can have a center hole where gases are fed through a ceramic gas nozzle. The gas distribution assembly 130 may be fabricated and/or coated by a ceramic material, such as silicon carbide, yttria, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds a substrate during processing, and may additionally hold a protective cover 144 during a cleaning process. An inner liner 118 may be coated on the periphery of the substrate support assembly 148. The inner liner 118 may be a halogen-containing gas resistant material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 bonded to a ceramic body (referred to as an electrostatic puck 166) via a bond 138. The electrostatic puck 166 may be fabricated by a ceramic material such as aluminum nitride (AlN) or aluminum oxide ($Al_2O_3$). The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. The gas passages may be fluidly coupled to a fluid source 172 of a thermally conductive gas, such as He via holes drilled in the puck 166. In operation, the gas may be provided at controlled pressure into the gas passages to enhance the heat transfer between the electrostatic puck 166 and a chucked substrate such as protective cover 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

The protective cover 144 may be a wafer or other component used to shield the electrostatic chuck 150 from a corrosive plasma during cleaning of the components in the interior volume 106. For example, the protective cover 144 may have a disc shape, a flat square shape, a flat rectangular shape, or other appropriate shape. The protective cover 144 may include a conductive portion that enables the protective cover 144 to be secured (chucked) by the electrostatic chuck 150 during the cleaning process. The protective cover 144 may additionally include a plasma resistant ceramic portion that is exposed to the corrosive plasma. The plasma resistant ceramic portion may have a plasma erosion rate of less than approximately 10 nanometers (nm) per radio frequency hour (RFHr). As shown, the protective cover 144 may have a diameter that is slightly greater than a diameter of the electrostatic chuck 150. For example, the protective cover 144 may have a diameter that is about 1-5 mm greater than a diameter of the electrostatic chuck 150. Accordingly, the protective cover 144 may extend beyond the edge of the substrate support assembly 152. This may decrease the exposure of the substrate support assembly 152 to the corrosive plasma during the cleaning process.

Figure 2A:
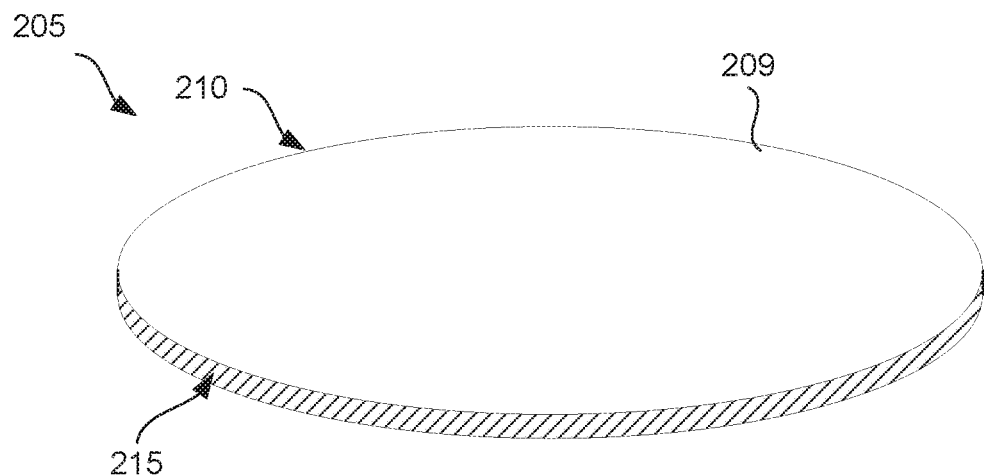
FIG. 2A depicts a top surface and side walls of one embodiment of a protective cover.
Figure 2B:
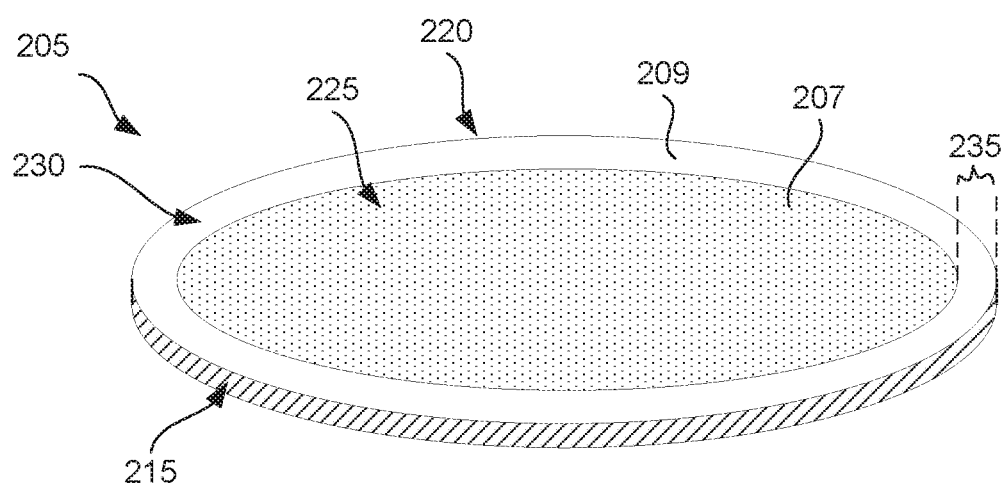
FIG. 2B depicts a bottom surface and side walls of one embodiment of a protective cover.
Figure 2C:
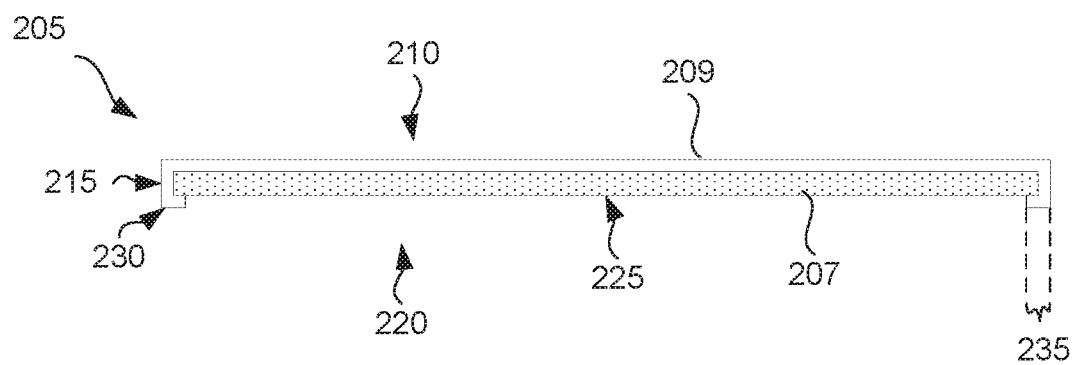
FIG. 2C depicts a cross sectional side view of one embodiment of a protective cover.

FIGS. 2A-2C depict various views of one embodiment of a protective cover 205 for an electrostatic chuck. FIG. 2A depicts a top surface 210 and side walls 215 of the protective cover 205. FIG. 2B depicts a bottom surface 220 and side walls 215 of the protective cover 205. FIG. 2C depicts a cross sectional side view of the protective cover 205.

In one embodiment, the protective cover 205 has a shape that corresponds approximately to a shape of an electrostatic chuck that is to be protected. For example, a top of an electrostatic chuck may be circular, and the protective cover 205 may have a disc or wafer shape as shown. Alternatively, other shapes may be used for the protective cover 205. The protective cover 205 may include a solid bulk conductive wafer 207 at least partially coated by a plasma resistant ceramic layer 209.

The solid bulk conductive wafer 207 may be a silicon wafer, a silicon carbide wafer, a doped aluminum nitride wafer, a doped aluminum oxide wafer, or another type of conductive wafer. Doped aluminum oxide wafers and doped aluminum nitride wafers may be doped with samarium (Sm), cerium (Ce), or other rare earth metal to cause the wafers to have resistivity of less than about $10^{13}$ Ohm-cm. In one embodiment, the solid bulk conductive wafer 207 is a metal wafer such as an aluminum wafer. The wafer 207 may have a thickness of between about 100 microns to about 2 mm Thicker wafers may have greater structural strength and greater rigidity. Thinner wafers may have a lower structural strength and greater flexibility.

The plasma resistant ceramic layer 209 is a deposited or grown layer. The plasma resistant ceramic layer 209 may be a ceramic such as $Y_2O_3$ (yttria or yttrium oxide), $Y_4Al_2O_9$ (YAM), $Al_2O_3$ (alumina), $Y_3Al_5O_{12}$ (YAG), YAlO3 (YAP), Quartz, $Si_3N_4$ (silicon nitride), AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The plasma resistant ceramic layer 209 may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The plasma resistant ceramic layer 209 may also be a ceramic composite that includes a yttrium oxide (also known as yttria and $Y_2O_3$) containing solid solution. For example, the plasma resistant ceramic layer 209 may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In one embodiment, the plasma resistant ceramic layer 209 is a composite ceramic coating composed of a compound $Y_4Al_2O_9$ (YAM) and a solid solution $Y_2$-$xZr_xO_3$ ($Y_2O_3$—$ZrO_2$ solid solution). In a further embodiment, the plasma resistant ceramic layer includes 62.93 mol % $Y_2O_3$, 23.23 mol % $ZrO_2$ and 13.94 mol % $Al_2O_3$. In another embodiment, the plasma resistant ceramic layer can include $Y_2O_3$ in a range of 50-75 mol %, $ZrO_2$ in a range of 10-30 mol % and $Al_2O_3$ in a range of 10-30 mol %. In other embodiments, other distributions may also be used for the composite ceramic coating. In one embodiment, the composite ceramic is a yttrium oxide containing solid solution that may be mixed with one or more of $ZrO_2$, $Al_2O_3$, or combination thereof.

In one embodiment, the plasma resistant ceramic layer 209 is yttrium aluminum garnet (YAG) composed of 35 mol % $Y_2O_3$, 65 mol % $Al_2O_3$. In another embodiment, the plasma resistant ceramic layer 209 can be YAG composed of 30-40 mol % $Y_2O_3$ and 60-70 mol % $Al_2O_3$.

The exterior top surface 210 and side walls 215 of the protective cover 205 are composed of the plasma resistant ceramic layer 209. The bottom surface 220 of the protective cover includes an inner region 225 made up of the solid bulk conductive wafer 207 and an outer perimeter 230 made up of the plasma resistant ceramic layer 209. A width 235 of the outer perimeter 230 may be approximately 3-5 microns. Alternatively, the width 235 may be greater, such as up to 10 or 20 microns. In a further embodiment, the width 235 may be up to about 1-5 millimeters.

Some plasma resistant ceramic materials may have a hardness that is lower than a hardness of the conductive wafer. Due to the lower hardness, the plasma resistant ceramic coating could wear out and introduce particle contamination if the plasma resistant ceramic coating were to rest on the electrostatic chuck. Accordingly, in one embodiment, the inner region 225 has a diameter that matches or is greater than diameter of an electrostatic chuck that is to be protected. The width 235 may be sufficient to span up to the distance between the outer edge of the protective cover 205 and the electrostatic chuck when the protective cover is chucked. Accordingly, the uncoated inner region 225 and not the outer perimeter 230 makes contact with (e.g., rests on) the electrostatic chuck while the protective cover is chucked.

The plasma resistant ceramic layer 209 on the top surface 210 may have a thickness of about 3-20 microns (with a thickness of about 5-10 microns in one embodiment). The plasma resistant ceramic layer 209 on the side walls 215 may have a thickness that approximately matches the thickness of the plasma resistant ceramic layer 209 on the top surface 210. The plasma resistant ceramic layer 209 on the bottom surface may have a thickness of between about 2 microns and about 20 microns.

In one embodiment, in which the conductive wafer 207 has a thickness of greater than about 200 microns, the conductive wafer 207 is a rigid structure. In one embodiment, the wafer has a thickness of about 200 microns to 2 mm. Deposition of the plasma resistant ceramic layer 209 on the top surface 210 may introduce strain, which can cause the conductive wafer 207 (and thus the protective cover 205) to bow or cup. As the bow of the protective cover 205 increases, the ability of an electrostatic chuck to secure the protective cover 205 decreases. A bow of about 300 microns or more (or 200 microns or more in some embodiments) may prevent an electrostatic chuck from chucking the protective cover 205.

The thickness of the plasma resistant ceramic layer 209 on the bottom surface 220 may be selected to counteract bowing of the conductive wafer caused by the plasma resistant ceramic layer 209 on the top surface 210. Because less of the bottom surface 220 is covered, a thickness of the plasma resistant ceramic layer 209 on the bottom surface 220 may be thicker than a thickness of the plasma resistant ceramic layer 209 on the top surface 210. For example, the plasma resistant ceramic layer 209 on the bottom surface may have a thickness of 10-20 microns to counteract stress introduced by a 3-5 micron layer on the top surface 210.

In one embodiment, in which the conductive wafer 207 has a thickness of less than about 200 microns, the conductive wafer 207 is a flexible structure. For example, the conductive wafer may have a thickness of about 50-200 microns in one embodiment. If the conductive wafer 207 is a flexible structure, it can be pulled flat by the electrostatic chuck during chucking with relative ease. Accordingly, the protective cover 205 can be chucked successfully even if it has a curvature of greater than 300 microns.

As mentioned, the curvature of the conductive wafer 207 may be of reduced importance if the conductive wafer 207 is flexible. Additionally, the bottom surface 220 of the protective cover 205 may be ground flat after deposition of the plasma resistant ceramic layer 209. In either instance, a thickness of the plasma resistant ceramic layer 209 on the bottom surface 220 may be the same as or lower than the thickness of the plasma resistant ceramic layer 209 on the top surface 210. A lower thickness on the bottom surface 220 is acceptable because the bottom surface will not be in a direct line of sight of a produced plasma. Accordingly, wear on the bottom surface 220 will be less than wear on the top surface 210. The thickness of the plasma resistant ceramic layer on the bottom surface 220 may therefore be less than 5 microns (e.g., 1-3 microns in one embodiment).

Figure 3:
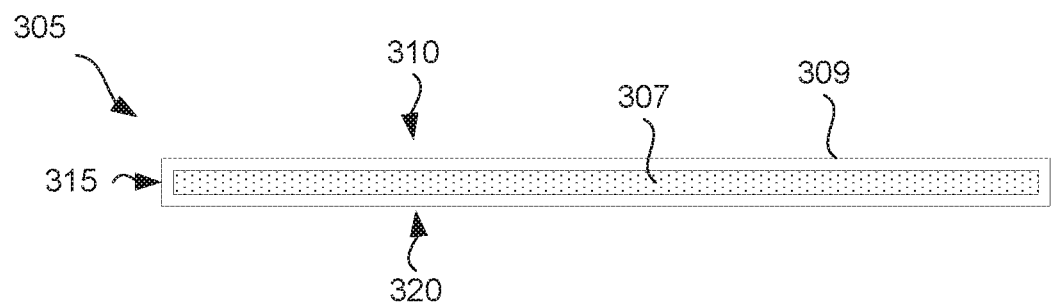
FIG. 3 depicts a cross sectional side view of another embodiment of a protective cover.
Figure 4:
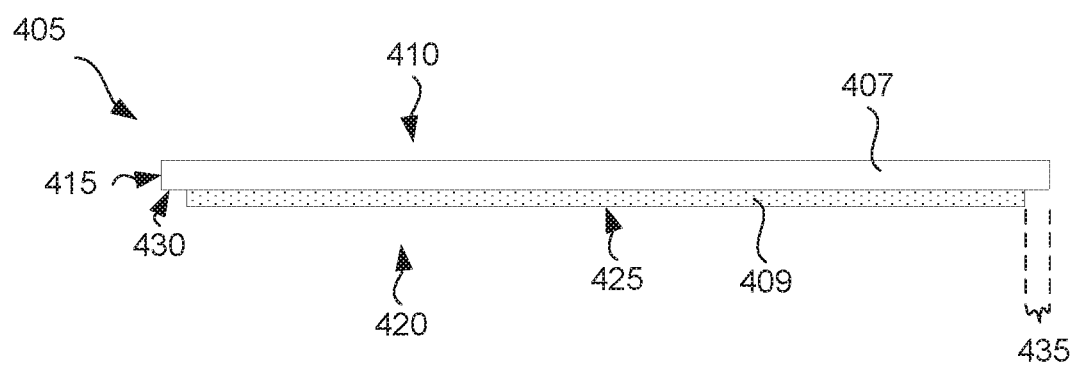
FIG. 4 depicts a cross sectional side view of yet another embodiment of a protective cover.
Figure 5:
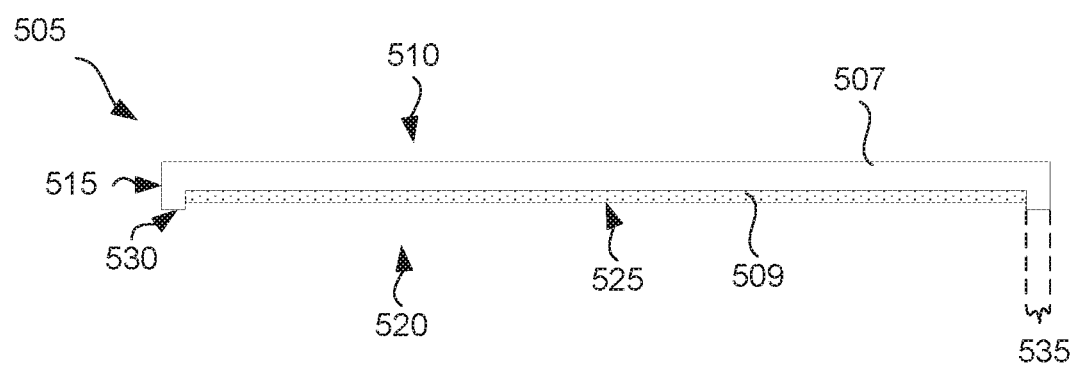
FIG. 5 depicts a cross sectional side view of still another embodiment of a protective cover.

FIGS. 3-5 illustrate cross sectional side views of various embodiments for protective covers. FIG. 3 depicts a cross sectional side view of a protective cover 305 having a conductive wafer 307 completely coated on a top surface 310, side walls 315 and bottom surface 320 by a plasma resistant ceramic layer 309. Some plasma resistant ceramics such as YAG have a high hardness and will not wear out due to contact with an electrostatic chuck. If such plasma resistant ceramic materials are used, then prolonged contact of the plasma resistant ceramic layer 309 to the electrostatic chuck should not introduce particle contamination. In one embodiment, the plasma resistant ceramic layer 309 has an approximately uniform thickness of up to about 5 microns on the top surface 410, the bottom surface 420 and the side walls 415.

FIG. 4 depicts a cross sectional side view of a protective cover 405 composed of a plasma resistant bulk sintered ceramic wafer 407 with a conductive layer 409 deposited thereon. The plasma resistant bulk sintered ceramic wafer 407 may include any of the aforementioned species of ceramics. However, the previously discussed ceramics were deposited ceramics, whereas the ceramic wafer 407 is a bulk sintered ceramic. Alternatively, the plasma resistant ceramic wafer may be a sapphire or MgAlON wafer. The ceramic wafer 407 may have a thickness of about 1-3 mm. The plasma resistant ceramic wafer may have a plasma erosion rate for the plasma environments that it will be used in of less than about 10 nm/RFHr.

As shown, a top surface 410 and side walls 415 of the plasma resistant bulk sintered ceramic wafer 407 are not coated by the conductive layer 409. Additionally, an outer perimeter 430 of the bottom surface 420 of the ceramic wafer 407 is not covered by the conductive layer 409. Since the conductive layer 409 may not be plasma resistant, leaving the outer perimeter 430 of the ceramic wafer 407 uncoated may prevent corrosion of the conductive layer 409. A width 435 of the uncoated outer perimeter 430 may be about 3-5 microns in one embodiment or up about 5 mm in another embodiment. A coated inner region 425 that is covered by the conductive layer 409 may have a diameter that corresponds to an outer diameter of a top of an electrostatic chuck that the protective cover 405 will be used on. Alternatively, the coated inner region 425 may have a diameter that is larger or smaller than the diameter of the electrostatic chuck.

Note that in some embodiments, the plasma resistant ceramic wafer may be doped or otherwise treated to cause the plasma resistant ceramic wafer itself to have a resistivity of less than about $10^{13}$ Ohm-cm. This may enable the plasma resistant ceramic wafer to be chucked by an electrostatic chuck without coating any surface of the plasma resistant ceramic wafer using a conductive layer. For example, a YAG plasma resistant ceramic wafer may be heat treated to control a defect density in the wafer. The defect density may control a resistivity of the YAG wafer. The heat treatment may be performed during sintering of the ceramic wafer. Sintering parameters that may be adjusted during the sintering of the YAG wafer to control defect density include a sintering temperature, a time add temperature and a gas atmosphere (e.g., a ratio of oxygen to other chamber gases).

Materials such as aluminum nitride and aluminum oxide may be plasma resistant for some plasma environments but not others. For example, aluminum nitride may be plasma resistant for oxygen or nitrogen based plasmas, but may not be plasma resistant for fluorine based plasmas. If an aluminum nitride wafer is to be used in a plasma environment with nitrogen or oxygen based plasmas, then the aluminum nitride wafer may be doped to lower a resistivity of the aluminum nitride wafer to below about $10^{13}$ Ohm-cm. In such an instance, the aluminum nitride wafer would operate as both a plasma resistant ceramic wafer and as a conductive wafer. Dopant materials used to reduce the resistivity of the aluminum oxide or aluminum nitride wafers include cerium, samarium, or other rare earth metals.

FIG. 5 depicts a cross sectional side view of a protective cover 505 composed of a plasma resistant bulk sintered ceramic wafer 507 with a conductive layer 509 deposited thereon. Similar to the protective cover 405, in protective cover 505 a top surface 510 and side walls 515 of the plasma resistant bulk sintered ceramic wafer 507 are not coated by the conductive layer 509. Additionally, an outer perimeter 530 of the bottom surface 520 of the ceramic wafer 507 is not covered by the conductive layer 509.

As illustrated, the ceramic wafer 507 has a non-planar bottom surface 520. Specifically, the bottom surface 520 of the ceramic wafer 507 has a raised edge or outer perimeter 530. The raised outer perimeter may have a width 535 of about 3 mm to about 10 mm (e.g., about 5 mm in one embodiment), and may have a height of about 3-30 microns. The raised outer perimeter 530 may be produced by removing material from an inner region 525 of the bottom surface 520, such as by grinding or etching. The raised outer perimeter 530 may protect the conductive layer 509 from exposure to plasma during a cleaning process.

Figure 6A:
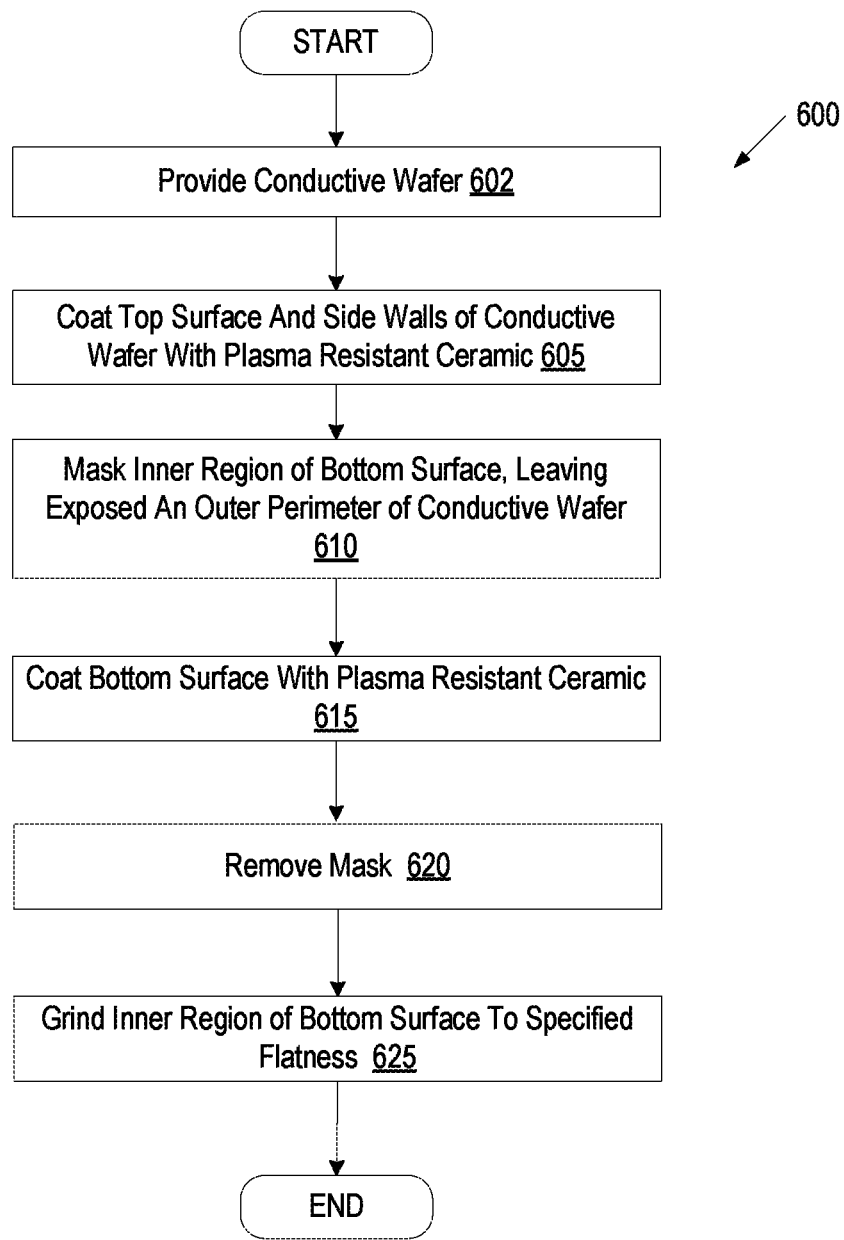
FIG. 6A illustrates one embodiment of a process for manufacturing a protective cover for an electrostatic chuck.

FIG. 6A illustrates one embodiment of a process 600 for manufacturing a protective cover for an electrostatic chuck. At block 602 of process 600, a conductive wafer such as a silicon wafer or a silicon carbide wafer is provided. At block 605, a top surface and side walls of the conductive wafer are coated with a plasma resistant ceramic layer. The plasma resistant ceramic layer may be deposited by traditional atmospheric plasma spray, low pressure plasma spray (LPPS), vacuum plasma spray (VPS), physical vapor deposition (PVD), chemical vapor deposition (CVD), ion assisted deposition (IAD), immersion coating, sputtering, thermal spraying, hot isostatic pressing, cold isostatic pressing, lamination, compression molding, casting, compacting, sintering or co-sintering techniques. In one embodiment, plasma resistant ceramic layer is plasma sprayed onto the conductive wafer. In another embodiment, the plasma resistant ceramic layer is deposited on the conductive wafer using ion assisted deposition (IAD).

At block 610, an inner region of a bottom surface of the conductive wafer is masked, leaving exposed an outer perimeter of the conductive wafer. At block 615, the bottom surface of the conductive wafer is coated with the plasma resistant ceramic. At block 620, the mask is removed. Since the inner region of the bottom surface was covered by the mask, the inner region remains uncoated.

After deposition of the plasma resistant ceramic layer on the top surface, side walls and bottom surface, introduced stresses may cause the conductive wafer to bow. Accordingly, at block 625 the inner region of the bottom surface may be ground to a specified flatness. A platen that is approximately the size of the inner region may be used to flatten the inner region without disturbing the coated outer perimeter on the bottom surface. In one embodiment, the inner region is ground to a flatness of 200 microns or better (in which a highest area of a surface of the wafer is at most 200 microns higher than a lowest area of the surface). A flatness of 200 microns may also be referred to as a bow or curvature of 200 microns. In another embodiment, the inner region may be ground to a flatness of 50 microns or flatter. For example, silicon carbide is very rigid. Accordingly, a specified flatness of 50 microns may be used for silicon carbide wafers.

Figure 6B:
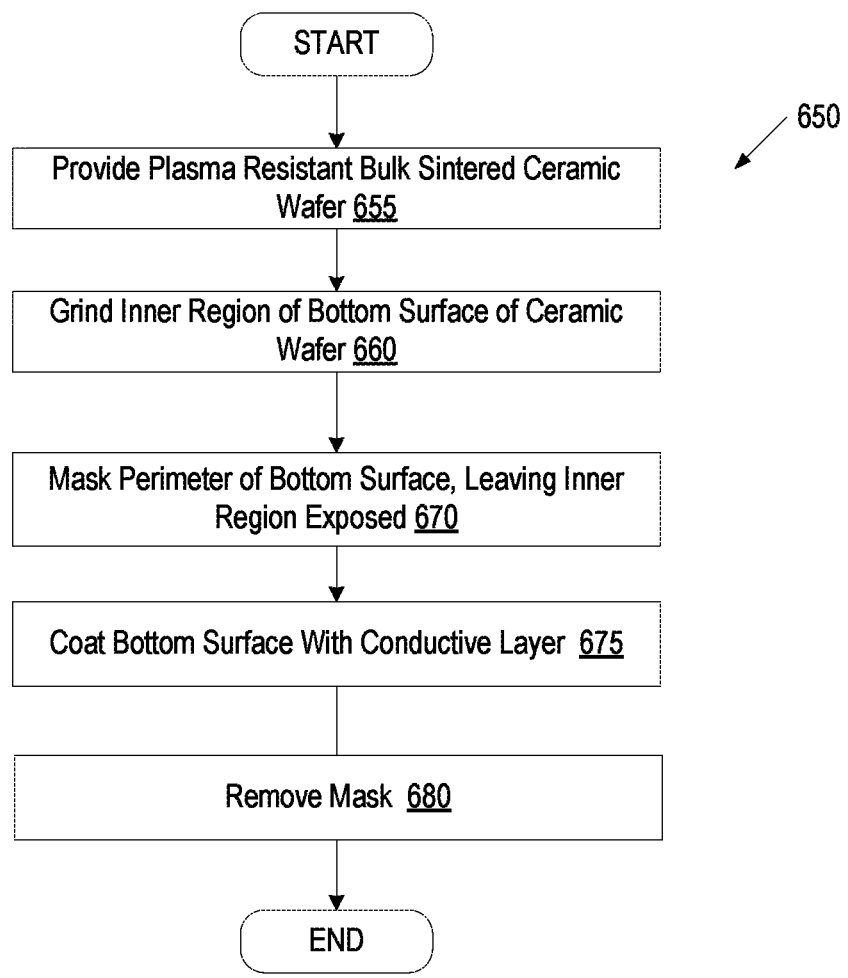
FIG. 6B illustrates another embodiment of a process for manufacturing a protective cover for an electrostatic chuck.

FIG. 6B illustrates another embodiment of a process 650 for manufacturing a protective cover for an electrostatic chuck. At block 655 of process 650, a plasma resistant bulk sintered ceramic wafer is provided. In one embodiment, at block 660 an inner region of a bottom surface of the ceramic wafer is ground. Grinding of the inner region may cause the outer perimeter of the bottom surface to be raised. Alternatively, the operations of block 660 may be skipped.

At block 670, the outer perimeter of the bottom surface is masked, leaving the inner region exposed. In one embodiment, the exposed inner region corresponds to the region that was ground at block 660. At block 675, the bottom surface of the ceramic wafer is coated with a conductive layer. Sputtering, plasma spraying, CVD, PVD, IAD, or other deposition techniques may be used to form the conductive layer. At block 680, the mask is removed. Since the mask covered the outer perimeter of the bottom surface, the outer perimeter may be uncoated by the conductive layer.

Figure 7:
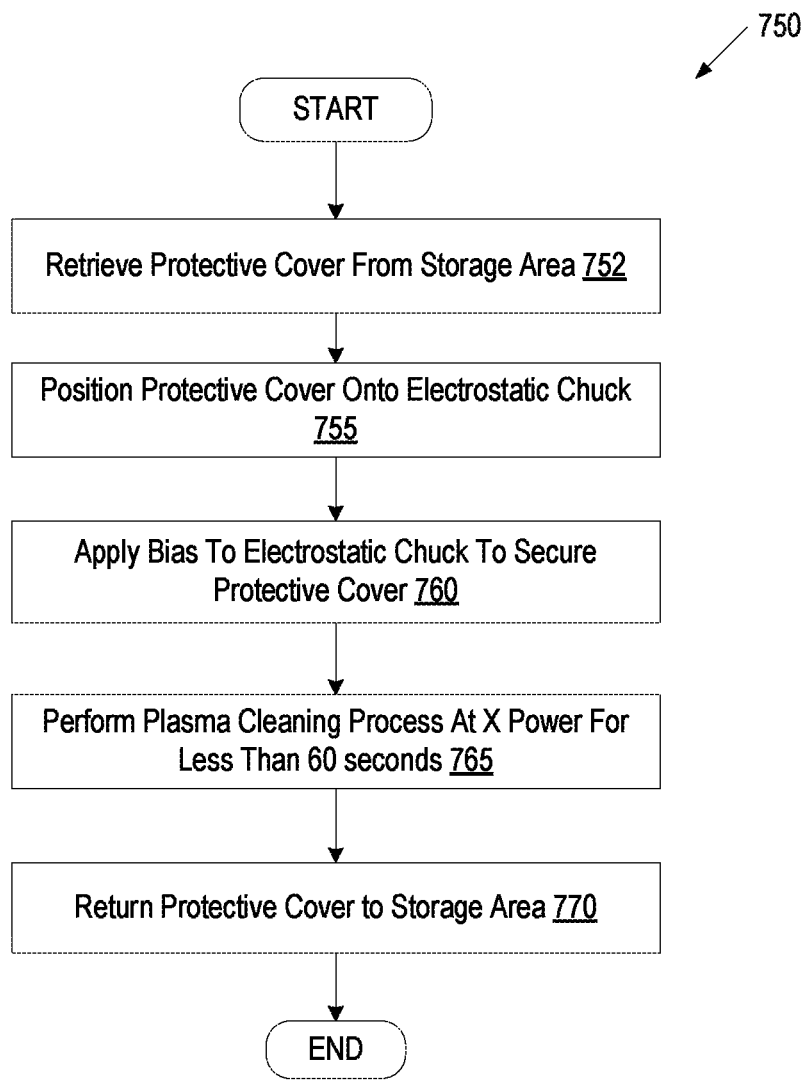
FIG. 7 illustrates one embodiment of a process for cleaning a processing chamber using a protective cover for an electrostatic chuck.

FIG. 7 illustrates one embodiment of a process 750 for cleaning a processing chamber using a protective cover for an electrostatic chuck. Process 750 may be performed between uses of the process chamber. For example, process 750 may be performed after a process is complete to clean the processing chamber and prepare it for a next process.

At block 752 of process 750 a robotic arm retrieves a protective cover from a storage area. The storage area may be a wafer transfer area or may be a dedicated storage area in or attached to the processing chamber. The dedicated storage area may hold one or a few protective covers, and may have a shield that is lowered to retrieve and return the protective covered, and that is raised prior to processing or cleaning.

At block 755, the protective cover is positioned onto an electrostatic chuck by the robotic arm. At block 760, a bias is applied to the electrostatic chuck to secure or chuck the protective cover. The protective cover may not have a flat backside. For example, the backside (bottom surface) may have a curvature of up to about 300 microns. In such an instance, a short duration pulse is applied initially. The short duration pulse is a high voltage bias (approximately 1.5 times a standard chucking bias) that shocks the protective cover, forcing the protective cover flat. After the short duration pulse, a voltage used for the bias may be reduced to the standard chucking bias, which is typically about 1800V for a coulombic electrostatic chuck. The short duration pulse enables a protective cover with a curvature of up to about 300 microns to be chucked.

At block 765, a plasma cleaning process is performed at up to about 1300 Watt power for less than 60 seconds. A typical plasma cleaning process is performed at around 1500 Watt power to minimize corrosion of an electrostatic chuck due to the cleaning. However, use of the protective cover enables the power to be increased up to about two times the standard power. By increasing the power, an effectiveness of the cleaning process is improved. As a result, the cleaning may reduce or remove a vertical wall buildup of material on a sidewall of the electrostatic chuck. Additionally, the improved cleaning process may extend an amount of time between scheduled maintenance cleanings up to about 600 radio frequency hours (RFHrs). Moreover, a duration of the cleaning process may be reduced from a typical cleaning time of 90 seconds down to below 60 seconds, and in one embodiment down to about 30 seconds. The reduced duration may improve cycle times for process chambers. At block 770, the protective cover is returned to the storage area, and the process chamber may be used for subsequent processing of wafers.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of cleaning a process chamber housing an electrostatic chuck comprising:
    retrieving a protective cover from a storage area, the protective cover comprising:
        a conductive wafer having a resistivity of less than approximately $10^{13}$ Ohm-cm; and
        a plasma resistant ceramic layer, wherein the plasma resistant ceramic layer covers a top surface of the conductive wafer, side walls of the conductive wafer and an outer perimeter of a bottom surface of the conductive wafer, and wherein an uncoated portion of the bottom surface has a post polish curvature of less than approximately 300 microns;
    positioning the protective cover onto the electrostatic chuck;
    applying a bias to the electrostatic chuck to secure the protective cover, wherein the electrically conductive wafer of the protective cover enables the protective cover to be secured;
    performing a plasma cleaning process to clean the process chamber, wherein the protective cover protects the electrostatic chuck during the plasma cleaning process; and
    returning the protective cover to the storage area.

2. The method of claim 1, wherein a power of over 1500 Watts to approximately 3000 Watts is used for the plasma cleaning process.

3. The method of claim 2, wherein a duration of the plasma cleaning process is less than approximately 60 seconds.

4. The method of claim 2, wherein a duration of the plasma cleaning process is approximately 30 seconds.

5. The method of claim 1, wherein applying the bias comprises:
    initially applying a pulse of over 1800V to approximately 2700V to the electrostatic chuck; and
    subsequently applying approximately 1800V to the electrostatic chuck.

6. The method of claim 1, wherein:
the conductive wafer has a thickness of approximately 50 microns to approximately 2 millimeters;
the plasma resistant ceramic layer on the top surface has a thickness of approximately 5-10 microns; and
the plasma resistant ceramic layer on the side walls has a thickness of approximately 5-10 microns.

7. The method of claim 6, wherein:
the outer perimeter of the bottom surface covered by the plasma resistant ceramic layer extends approximately 3-5 millimeters inward from an edge of the conductive wafer; and
the plasma resistant ceramic layer on the outer perimeter of the bottom surface has a thickness of approximately 10-20 microns, wherein the plasma resistant ceramic layer on the outer perimeter of the bottom surface counteracts curvature of the conductive wafer caused by the plasma resistant ceramic layer on the top surface.

8. The method of claim 1, wherein the plasma resistant ceramic layer has an approximately uniform thickness of 3-10 microns.

9. The method of claim 1, wherein the conductive wafer comprises at least one of silicon, silicon carbide, doped aluminum nitride, doped aluminum oxide, or metal.

10. The method of claim 1, wherein the bottom surface of the conductive wafer comprises a raised edge, and wherein the plasma resistant ceramic layer covers the raised edge.

11. The method of claim 1, wherein the plasma resistant ceramic layer is selected from a group consisting of $Y_3Al_5O_{12}$, $Y_2O_3$, $Y_4Al_2O_9$, $Al_2O_3$, $YAlO_3$, $ZrO_2$ and $Y_2O_3$ stabilized $ZrO_2$ (YSZ), and a ceramic compound comprising $Y_4Al_2O_9$ and a solid-solution of $Y_2O_3$—$ZrO_2$.

12. A method of cleaning a process chamber housing an electrostatic chuck comprising:
retrieving a protective cover from a storage area, the protective cover comprising a plasma resistant ceramic portion and an electrically conductive portion having a resistivity of less than approximately $10^{13}$ Ohm-cm, wherein:
the plasma resistant ceramic portion comprises a top surface of the protective cover, side walls of the protective cover, and an outer perimeter of a bottom surface of the protective cover;
the electrically conductive portion comprises an inner region of the bottom surface of the protective cover; and
the bottom surface of the protective cover has a post polish curvature of less than approximately 300 microns;
positioning the protective cover onto the electrostatic chuck;
applying a bias to the electrostatic chuck to secure the protective cover, wherein the electrically conductive portion of the protective cover enables the protective cover to be secured;
performing a plasma cleaning process to clean the process chamber, wherein the protective cover protects the electrostatic chuck during the plasma cleaning process; and
returning the protective cover to the storage area.

13. The method of claim 12, wherein a power of over 1500 W to approximately 3000 W is used for the plasma cleaning process.

14. The method of claim 12, wherein a duration of the plasma cleaning process is less than approximately 60 seconds.

15. The method of claim 12, wherein a duration of the plasma cleaning process is approximately 30 seconds.

16. The method of claim 12, wherein applying the bias comprises:
initially applying a pulse of over 1800V to approximately 2700V to the electrostatic chuck; and
subsequently applying approximately 1800V to the electrostatic chuck.

17. The method of claim 12, wherein the plasma resistant ceramic portion has a plasma erosion rate of less than about 10 nanometers per radio frequency hour (nm/RFHr).

18. The method of claim 12, wherein:
the electrically conductive portion comprises a conductive wafer; and
the plasma resistant ceramic portion comprises a plasma resistant ceramic layer on a portion of the conductive wafer.

19. The method of claim 12, wherein the electrically conductive portion comprises at least one of silicon, silicon carbide, doped aluminum nitride or doped aluminum oxide.

20. The method of claim 12, wherein the plasma resistant ceramic portion consists essentially of a ceramic selected from a group consisting of $Y_3Al_5O_{12}$, $Y_2O_3$, $Y_4Al_2O_9$, $Al_2O_3$, $YAlO_3$, $Y_2O_3$ stabilized $ZrO_2$ (YSZ) and a ceramic compound comprising $Y_4Al_2O_9$ and a solid-solution of $Y_2O_3$—$ZrO_2$.

* * * * *